United States Patent [19]

Buerkle et al.

[11] Patent Number: 4,885,029

[45] Date of Patent: Dec. 5, 1989

[54] THIN SECTION DISPERSION STRENGTHENED COPPER BODY AND METHOD OF MAKING SAME

[75] Inventors: Thomas B. Buerkle, Greensburg, Pa.; Jack D. Troxell, North Olmsted, Ohio

[73] Assignee: SCM Metal Products, Inc., Cleveland, Ohio

[21] Appl. No.: 176,793

[22] Filed: Apr. 1, 1988

Related U.S. Application Data

[63] Continuation-in-part of Ser. No. 23,135, Mar. 9, 1987, abandoned.

[51] Int. Cl.[4] ............................................. C22C 29/12
[52] U.S. Cl. ...................................... 75/235; 75/232; 419/19

[58] Field of Search ..................... 75/232, 235; 419/19

[56] References Cited

U.S. PATENT DOCUMENTS

| | | | |
|---|---|---|---|
| 4,426,598 | 1/1984 | Whitman | 419/19 |
| 4,440,572 | 4/1984 | Nadkami et al. | 419/19 |
| 4,478,787 | 10/1984 | Nadkami et al. | 75/235 |
| 4,707,184 | 11/1987 | Hashiguchi et al. | 75/235 |
| 4,752,334 | 6/1988 | Nadkami et al. | 75/235 |

*Primary Examiner*—Stephen J. Lechert Jr.
*Attorney, Agent, or Firm*—Lieberman, Rudolph & Nowak

[57] ABSTRACT

A thin section fibrous, unrecrystallized dispersion strengthened copper body suitable for use in the manufacture of lead frames for integrated circuits and a method for making same.

21 Claims, 3 Drawing Sheets

THIN SECTION DISPERSION STRENGTHENED COPPER BODY AND METHOD OF MAKING SAME

This application is a continuation in part of U.S. patent application Ser. No. 023,135, filed on Mar. 9, 1987, abandoned. The teachings of that application are specifically incorporated by reference herein.

The invention relates to a thin section dispersion strengthened copper ("DSC") body and to a method for making it. The product is characterized by high strength, high electrical and thermal conductivity and a fibrous unrecrystallized microstructure. Attaining these features requires an enhanced recrystallization temperature. This enhanced recrystallization temperature is induced in the body by what we choose to call "inprocess heat treating". This means that during size reduction from a billet, a portion of the total size reduction is effected, and after that portion of the overall size reduction is completed, the resulting billet is heat treated. This may happen once or several times during size reduction.

BACKGROUND OF THE INVENTION AND PRIOR ART

A principal use for the invention is the production of lead frames for integrated circuits, although many other uses will occur to those skilled in the art, e.g., incandescent lamp leads such as described in U.S. Pat. No. 4,426,598 dated Jan. 17, 1984. With this understanding, the invention will, for convenience, be described with respect to lead frames.

Lead frames serve several purposes in electronic circuit packages, e.g., integrated circuits. They act as the interconnection between the active semiconducting device and the external circuit. They provide mechanical support for the active semiconducting device and provide a path for the dissipation of heat generated within the active semiconducting device.

To meet these requirements, a lead frame material should have suitable strength or stiffness to support the package containing the active semiconducting device (chip), and permit assembly to the external circuit, usually through multiple pins adapted to extend into rather tight fitting sockets without being damaged by bending. The latter consideration becomes increasingly important as the pin count increases and the leads become narrower, and hence weaker. The material of choice must also conform to manufacturing techniques typically used in the fabrication of electronic circuit packages.

A lead frame material must be capable of conducting electricity at low resistance to provide electrical connection between the host circuit and the active semiconducting device, i.e., it should preferably have a high electrical conductivity.

Proper functioning of the semiconductor at rated speed requires that the device be kept cool. This requires that the lead frame material have a high thermal conductivity to enable efficient heat dissipation.

The selected material should be amenable to chemical etching and/or stamping to form the basic shape of lead frame, (See FIG. 1), and have sufficient ductility to withstand forming during manufacture and assembly. Additionally, the lead frame material should be adaptable to electrochemical plating processes.

Lead frames are typically produced from copper alloy strip in very thin section (about 0.002" to about 0.015") because of the high electrical and thermal conductivities of this group of materials. Copper materials generally have adequate stiffness and strength for many current lead frame applications. However, increasingly complex circuits demanding higher pin counts need materials with higher strength and higher electrical and thermal conductivity.

Copper is capable of being strengthened through solid solution addition of other metallic elements. It is well documented that the small additions required to provide substantial strength improvement severely decrease the electrical conductivity when compared to unalloyed copper. Precipitation strengthened copper alloys, while generally having higher electrical conductivities than solid solution strengthened alloys may also have depressed electrical conductivities due to incomplete precipitation of the second phase. Alloys from other metal systems are sometimes used to increase the stiffness or strength of the lead frame in severe applications where a thermal expansion match with that of the encapsulating ceramic is required. Such a change, however, substantially reduces the electrical and thermal conductivity. Dispersion strengthened copper (DSC) however, combines the high strength and high electrical and thermal conductivities in a single material.

Other dispersion strengthened metals such as steel, copper/tin alloys, and the like may also be used in conjunction with this invention. For most purposes however, we prefer to use dispersion strengthened copper having a particle size prior to compaction of less than 20 mesh (U.S. Standard Screen Size) or about 800 microns which material has been internally oxidized prior to its entry into the process hereof.

Internal oxidation of the copper alloy (usually copper/aluminum) is carried out at an elevated temperature, for example from about 1200° F. to about 1800° F., for a period of time sufficient to cause reaction between the solute metal, e.g. aluminum and the oxidant, e.g. cuprious oxide provided in the powder mix.

Although the present invention will be described in connection with dispersion strengthened copper, it is to be understood that the procedures of the present invention are applicable as well to other dispersion strengthened metal powders. Thus, iron, silver, copper/tin (2%) may be dispersion strengthened with refractory metal oxide, such as aluminum oxide(alumina), titanium dioxide, magnesium oxide, silicon dioxide, zirconium oxide, and the like.

Dispersion strengthened copper which can be used with the instant invention can contain from about 0.1% wt. to about 1.1% wt. $Al_2O_3$.

Grades of internally oxidized dispersion strengthened copper (DSC) are identified herein by their grade designations as specified by the Copper Development Association: C15715, C15725, C15735, and C15760. These materials are copper based and contain, respectively about 0.3%, 0.5%, 0.7% and 1.1% by weight aluminum oxide. These materials are commercially available under the name "GLIDCOP" which is the registered trademark of SCM Metal Products, Inc., and are identified by SCM numbers "AL-15", "AL-25", "AL-35", and "AL-60" respectively.

The aluminum oxide particle size is exceedingly small, i.e., less than 0.1 micron, for example 30 to 100 Angstroms. The materials can be produced by internal oxidation as described in Nadkarni et al U.S. Pat. No.

3,779,714 dated Dec. 18, 1973 or Nadkarni U.S. Pat. No. 4,315,770 dated Feb. 16, 1982 (now No. Re 31,902 dated May 28, 1984). These patents are incorporated herein by reference thereto.

BRIEF STATEMENT OF THE INVENTION

The invention relates to a thin section dispersion strengthened copper body and to a method for making it. The product is characterized by high strength, high electrical and thermal conductivity and fibrous microstructure.

As indicated above, one example of this invention is a dispersion strengthened copper strip suitable for use in the manufacture of thin section articles, for example, lead frames and a method of producing such a strip. The strip is a thin section, substantially unrecrystallized fibrous dispersion strengthened copper body containing a refractory metal oxide, for example, aluminum oxide in an amount in the range of from about 0.1% to about 1.1% by weight as discrete micro particles having a particle size of less than 0.1 micron, uniformly dispersed throughout said copper body.

This material has minimum mechanical properties of yield strength from about 65 ksi to about 90 ksi, tensile strength of about 70 ksi, about 8 percent elongation, at least about 150 BTU/ft$^2$/ft/hr/°F. thermal conductivity, and about 78% IACS electrical conductivity. Further, the final product has a fibrous, substantially unrecrystallized microstructure, and is produced by a method which prevents recrystallization of the microstructure during processing.

BRIEF DESCRIPTION OF THE DRAWINGS

The invention will be better understood by having reference to the annexed drawings wherein.

DETAILED DESCRIPTION OF THE INVENTION

The present invention contemplates the use of a dispersion strengthened metal, particularly copper, which is densified from powder to from about 97% to about 100% of theoretical density prior to carrying out the process of the present invention. Densification is accomplished preferably by extrusion or hot isostatic pressing, or other compacting procedure, as will be more particularly mentioned below. U.S. Pat. Nos. 3,884,676 dated May 20, 1975 and 4,045,644 dated Aug. 30, 1977 provide details of extrusion processes useful herein. These patents are incorporated herein by reference.

Figure 1:
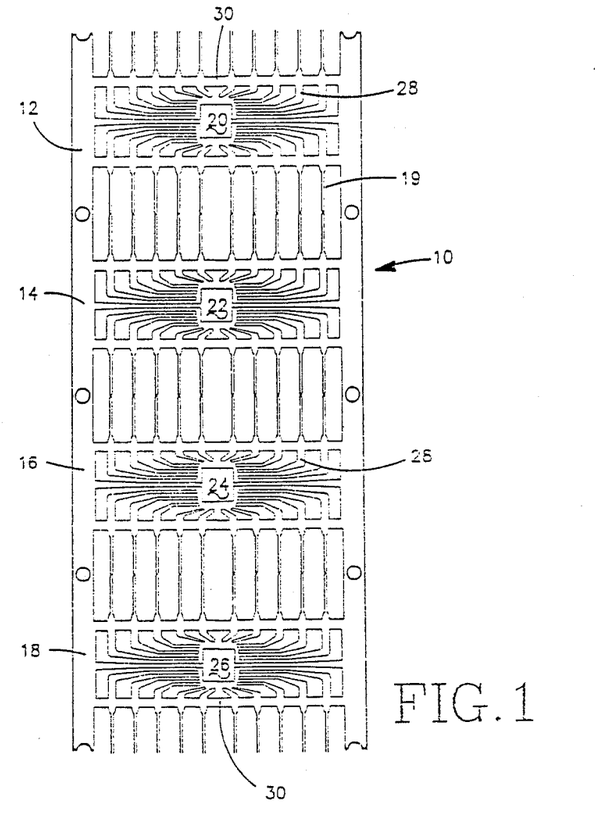
FIG. 1 is an illustration at substantially full scale of a lead frame blank in accordance with the present invention.

As indicated above, one embodiment of this invention provides an improved DSC body especially adapted for use in the production of thin-section articles, e.g., lead frames. FIG. 1 shows a portion of a 20-pin lead frame strip 10 before the individual lead frames 12, 14, 16 and 18, have been severed therefrom by cutting the strands 19, and plated. The physical structure is well known and includes a centrally located chip carrier 20, 22, 24 and 26 on which is secured the integrated circuit (not shown) and from which gold or aluminum connector wires (not shown) are attached to the individual pins, e.g., pin 28. The connector strips, or "dam bars", e.g., 30 are removed and the assembly placed in the lower portion of resinous "chip" (not shown), the leads bent 90° into proper position, and the cover (not shown) placed over the assembly and secured in place. The metal in such devices is fibrous and unrecrystallized.

As seen from the figures, a remarkable phenomenon is observed in respect of the recrystallization temperature during processing in accordance with this invention. By performing at least one heat treatment of the material as the size or thickness is reduced, the recrystallization temperature is elevated by about 300° F. to about 500° F. above its normal recrystallization temperature. It has been found that the higher the percentage by weight of the refractory oxide, for example, aluminum oxide, the less prone the body will be to recrystallization during subsequent processing, e.g. rolling. Advantage is taken of this unique property as will be described below.

DSC alloys are not generally prone to recrystallization of the cold worked microstructure, even after heating to a temperature near the melting point. This behavior is unique among copper alloys. Most conventional alloys of copper are susceptible to recrystallization at temperatures near or below about one half the melting point.

The processing of conventional copper alloys for thin section application is comprised of cold rolling from a suitable starting thickness, heat treating (annealing) to fully recrystallize the microstructure and cold rolling to final thickness. Cold rolling has the effect of increasing the yield strength and decreasing the ductility, as measured by elongation.

Figure 4:
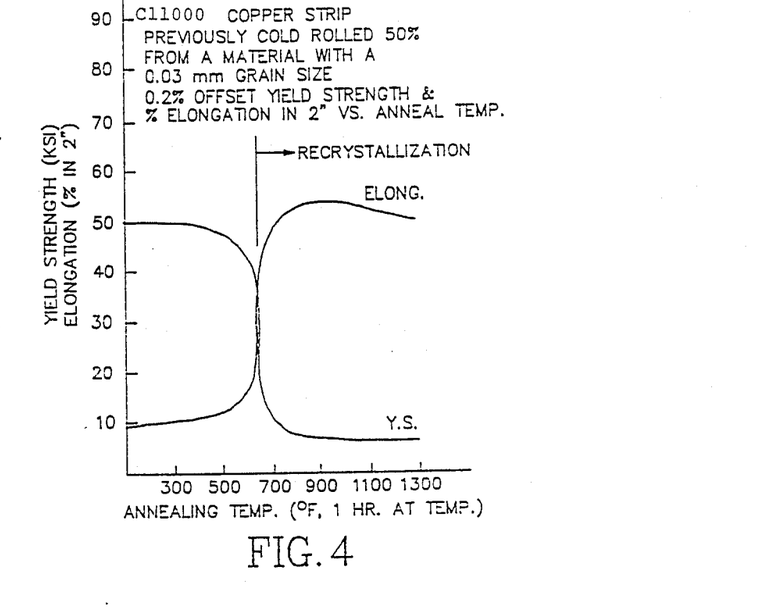
FIG. 4 shows the effect of full recrystallization in the properties of C11000 as a function of annealing temperature.

The response to cold deformation of C11000 is shown in FIG. 4 as a function of annealing temperature. It is important to note that recrystallization of the microstructure of a conventional copper strip alloy is accompanied by a dramatic decrease in yield strength and increase in ductility (elongation). The purpose of annealing in conventional copper alloys is to recrystallize and soften the material in preparation for further cold working to reduce thickness or for component fabrication by the end user. The recrystallization temperature for C11000 is approximately 650° F. or approximately one-third of the 1980° F. melting point.

As stated previously, prior art regarding DSC alloys indicates that this group of materials is resistant to recrystallization when heated to elevated temperatures. This material is typically cold rolled from a relatively thin starting thickness to finish gage without in-process heat treatment and is heat treated only at finish gage to provide the yield strength and/or ductility specified by the end user. DSC has a very low work hardening rate and therefore, it is not necessary to perform in-process heat treatment to accommodate further cold work required to reduce the thickness.

Figure 5:
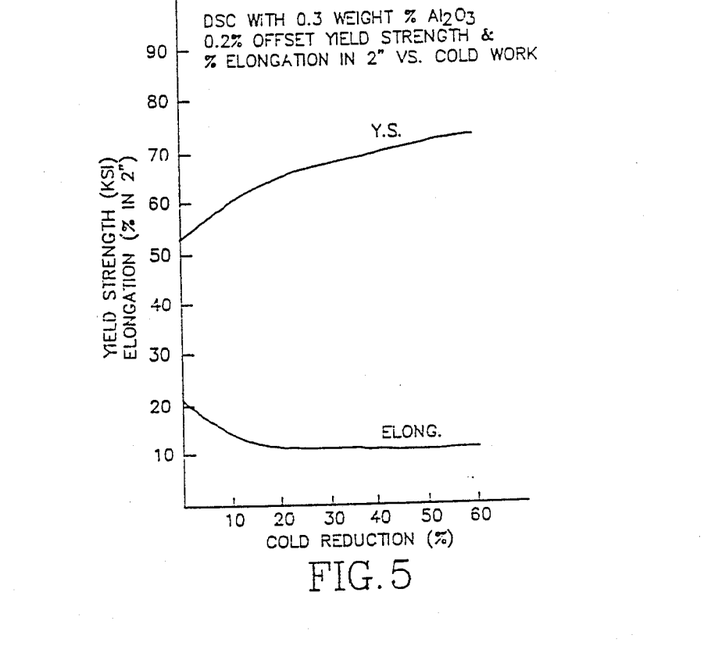
FIG. 5 shows the effect of cold reduction on the yield strength and elongation for dispersion strengthened copper containing 0.3 wt. % Al$_2$O$_3$.

The effect of cold reduction on the yield strength and elongation for DSC containing about 0.3 wt. % $Al_2O_3$ is shown in FIG. 5.

Figure 6:
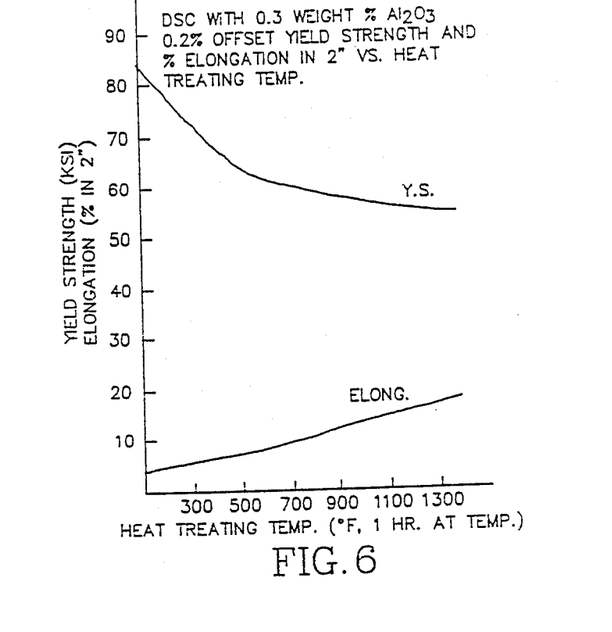
FIG. 6 shows the response of the mechanical properties of DSC to heat treatment performed at finish gage.

The response of the mechanical properties to heat treatment performed at finish gage is illustrated in FIG. 6. Note that the yield strength decreases and the elongation increases with increasing temperature, but this change in the properties is more gradual than observed for C11000.

The dramatic decrease in yield strength and increase in ductility seen in FIG. 4 for C11000 is a direct result of the recrystallization of the previously cold worked microstructure. The microstructure of DSC does not recrystallize at temperatures as high as 1800° F., or 9/10 of the 1980° F. melting point, and the heat treatment serves only to relieve internal stresses induced by cold work.

Figure 10:
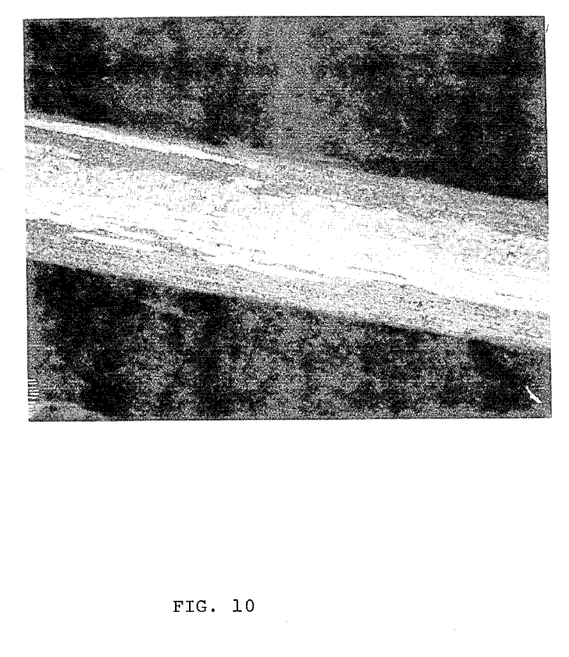
FIG. 10 is a photomicrograph showing a partially recrystallized microstructure.

It has been discovered that when thick starting stock is used and large cold reductions are employed to produce thin gage DSC strip, for applications such as lead frames, recrystallization of the microstructure can occur during heat treatment at finish gage. It has also been discovered that the onset of recrystallization in DSC is accompanied by a decrease in yield strength and ductility. The initial stages of recrystallization are characterized by a partially recrystallized microstructure, or duplex structure shown in FIG. 10. This duplex structure is undesirable because it reduces the ductility and gives nonuniform properties within the material observed in samples showing reduced ductility.

Figure 7:
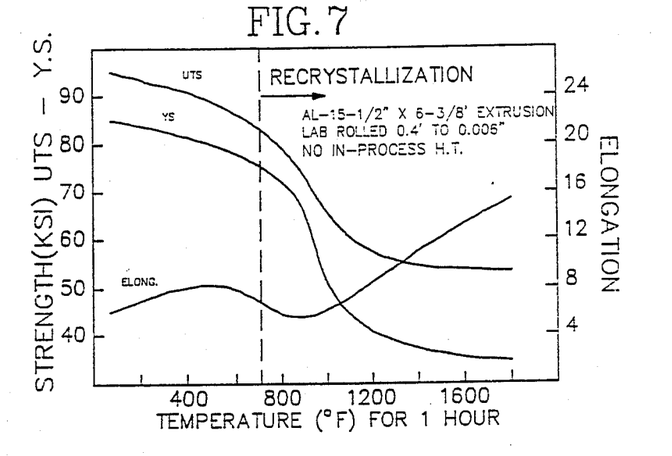
FIG. 7 is a graph showing the variation of ultimate tensile strength (UTS), yield strength (YS), elongation and recrystallization temperature for a commercial DSC containing 0.3% Al$_2$O$_3$ extruded to a bar 0.5" thick by 6.375" by 30 feet long which was milled to 0.4" to remove the copper cladding and then laboratory rolled to 0.006" with no in-process heat treatment.

FIG. 7 illustrates the effect of heat treating temperature on the mechanical properties of DSC with about 0.3 weight percent $Al_2O_3$. A decrease in strength with the onset of recrystallization would be expected with any metal system with an accompanying increase in elongation, but the decrease in elongation is believed to be unique to DSC and occurs only with processing requiring large cold reductions. Including one inprocess heat treatment at about 1600° F. for about one hour, effectively increases the recrystallization temperature by about 300° F.

Figure 8:
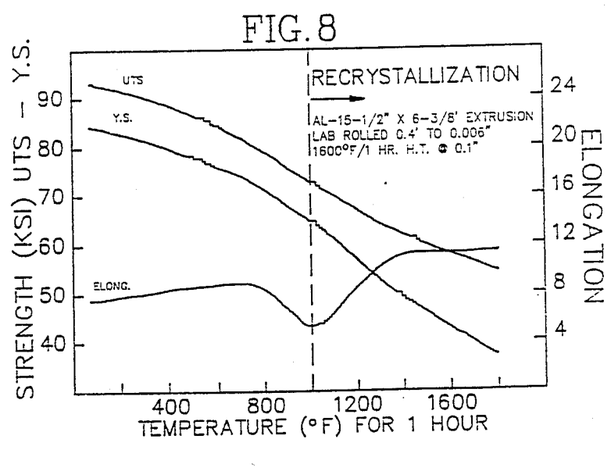
FIG. 8 is a graph similar to FIG. 7 for the same material and treated in the same manner but heat treated in process at 1600° F. for 1 hour at 0.1" thickness.
Figure 9:
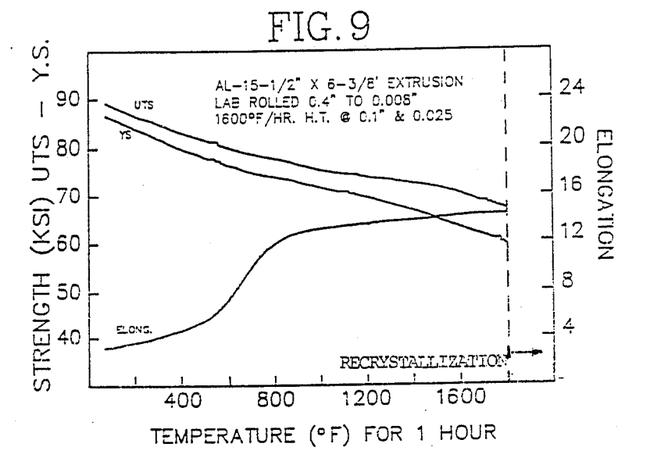
FIG. 9 is a graph showing the effect of multiple in-process heat treating steps on ultimate tensile strength (UTS), yield strength (YS) and % elongation for the same material.

Comparison of FIG. 8 to FIG. 7 shows that the recrystallization temperature is raised from about 700° F. for material processed without in-process heat treatment to about 1000° F. for the process which includes one in-process heat treatment following the initial 75% cold work. Further, FIG. 9 illustrates that the recrystallization temperature is about 1800° F. when two in-process heat treatments at about 1600° F. are employed.

Figure 11:
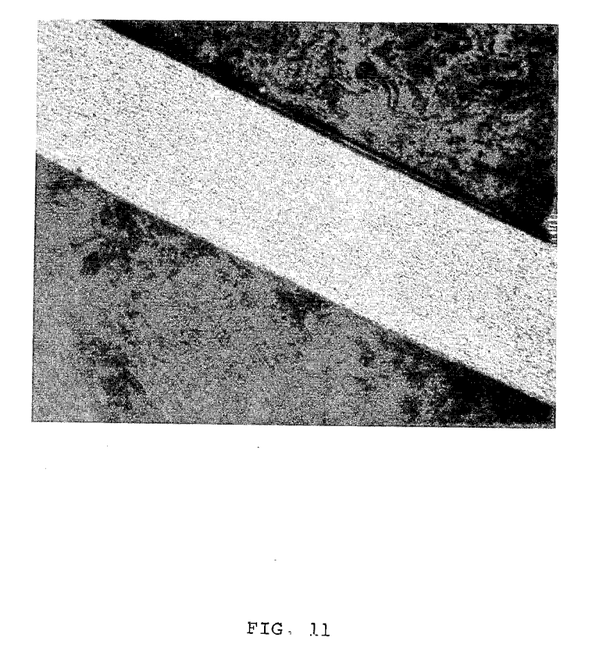
FIG. 11 is a photomicrograph showing a fibrous unrecrystallized microstructure.

A homogenous unrecrystallized fibrous microstructure as shown in FIG. 11 was observed in these specimens which were heat treated following initial cold reduction of about 75% and a subsequent cold reduction of about 75%. A net increase in recrystallization temperature of greater than about 900° F. is achieved with two in-process heat treatments (FIG. 9) as compared to no in-process heat treatments (FIG. 7).

Note in FIGS. 7 and 8 that the onset of recrystallization occurs near the heat treating temperature suitable for obtaining about 70 ksi yield strength in the finished product. This temper range, known as T-70 temper, is one of the desired finished product specifications, and maximum ductility in this temper cannot be achieved with the recrystallized structure. It is important to note that the inprocess heat treatments illustrated in FIGS. 8 and 9 do not promote recrystallization of the microstructure and the inprocess heat treated material exhibits the same fibrous, unrecrystallized microstructure observed in the final product.

The in-process heat treatment developed for DSC alloys differs from the in-process annealing performed routinely on conventional copper alloys because heat treatment of DSC is designed to avoid recrystallization due to the deleterious effect on ductility, while recrystallization of conventional copper material is desired to increase ductility. Additionally, inprocess heat treatment of DSC alloys is deemed necessary to avoid the duplex structure characteristic of partially recrystallized DSC and correspondingly lower ductilities.

Table I below illustrates the superior combination of strength, ductility, and electrical conductivity of lead frame strip materials made from DSC in accordance with the instant invention, as compared to several common lead frame strip materials.

TABLE I

| CDA Alloy No. (Temper) | UTS (ksi) | D.2% YS (ksi) | Elongation (% in 2″) | Electrical Conductivity (% IACS) | Thermal Conductivity (BTU/ft2/ft/hr/°F. |
|---|---|---|---|---|---|
| DSC (C15760) (T-95) | 106 | 95 | 7 | 78 | 177 |
| DSC (C15760) (T-90) | 100 | 90 | 8 | 78 | 177 |
| DSC (C15760) (T-80) | 90 | 83 | 9 | 78 | 177 |
| DSC (C15715) (T-70) | 75 | 70 | 13 | 92 | 211 |
| DSC (C15715) (T-80) | 84 | 80 | 10 | 92 | 211 |
| C19400 (Spring) PRIOR ART | 75 | 65 | 6 | 65 | 150 |
| C19500 (Hard) PRIOR ART | 85 | 80 | 3 | 50 | 115 |
| C15100 (Extra Hard) PRIOR ART | 65 | 60 | 4 | 93 | 213 |

TABLE I-continued

| CDA Alloy No. (Temper) | UTS (ksi) | D.2% YS (ksi) | Elongation (% in 2") | Electrical Conductivity (% IACS) | Thermal Conductivity (BTU/ft²/ft/hr/°F.) |
|---|---|---|---|---|---|
| Alloy 42 (½ Hard) | 97 PRIOR ART | 94 | 5 | 2 | 6 |
| C10200 | 50 PRIOR ART | 45 | 5 | 99 | 227 |

Figure 2:
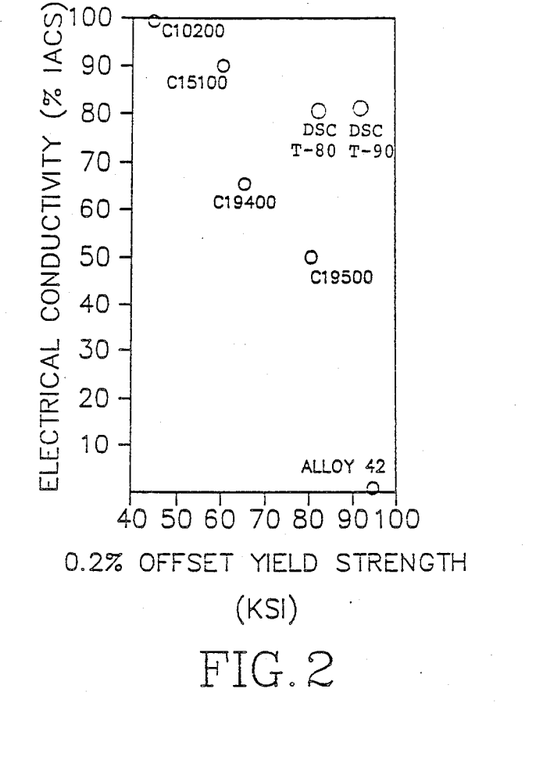
FIG. 2 is a plot of electrical conductivity as a function of yield strength for lead frame strip materials.
Figure 3:
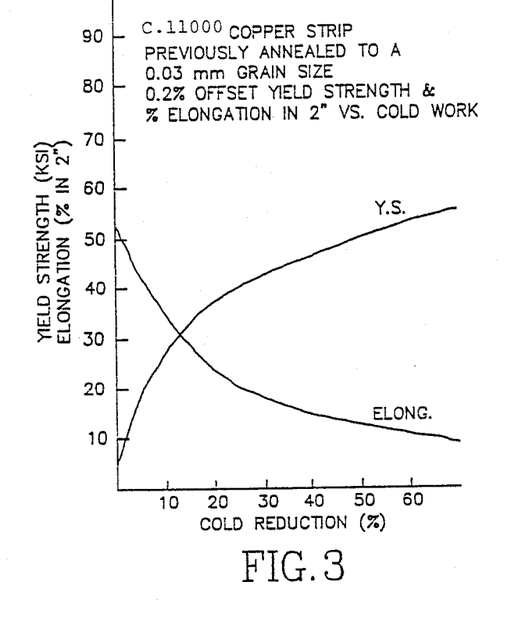
FIG. 3 shows the response of C11000 copper alloy to cold reduction in respect of yield strength and % elongation.

The IACS electrical conductivity shown for the two $Al_2O_3$ DSC alloys C15715 and C15760 is surpassed only by C10200 (pure copper) and C15100 of the other lead frame materials shown. This combination of properties is further illustrated in FIG. 2 where electrical conductivity is plotted as a function of yield strength. DSC provides the best combination of these properties among all lead frame materials (shown in the upper right hand portion of FIG. 2).

Alloy 42 is an iron-nickel alloy typically used in applications where the strength levels of conventional copper alloys are not sufficient.

One method of making a thin section fibrous, dispersion strengthened copper body comprises the steps of:
(a) consolidating a powder of said dispersion strengthened copper to substantially full density (about 97% to about 100% theoretical density) to form a solid body;
(b) reducing the size of said body in successive stages to a convenient thickness, for example about 0.100 inch or less;
(c) at intervals during said size reduction, heating the body to a temperature of at least about 600° F. to relieve cold work strain for a period of at least about 30 minutes or until the recrystallization temperature of the body has been elevated to a high enough level that enables one to obtain desired mechanical strength and ductility without recrystallization for a section having a convenient thickness, for example, of about 0.100 inch; and
(d) continuing the size reduction to the desired thickness, in the range of about 0.001" to about 0.030".

The following Examples illustrate thin section DSC strip made by the process of this invention from sections consolidated by extrusion and hot isostatic pressing.

EXAMPLE 1

DSC powder containing about 0.3 wt. % aluminum oxide was contained in a copper canister and hot extruded to provide a bar with a rectangular cross section about ½ inch thick by about 6⅜ inches wide. The bar was then cold rolled to finish gages of about 0.006" to about 0.010" with two in-process heat treatments.

Strip at finish gage was temper heat treated to provide mechanical properties to meet specific requirements of the end user. Properties of this DSC strip are shown in Table II. Also shown is data on DSC containing 0.5 wt. % $Al_2O_3$ which did not need in process heat treatments to achieve similar properties in the finished product.

TABLE II

| Typical Properties of Heat Treated DSC Strip | | | |
|---|---|---|---|
| $Al_2O_3$ Content (Weight %) | 0.3 | | 0.5 |
| Temper Heat Treatment (°F./1 Hr.) | 600 | 1000 | 600 |
| U.T.S. (ksi) | 81 | 75 | 90 |
| 0.2% Y.S. (ksi) | 79 | 70 | 82 |
| Elongation (% in 2") | 7 | 14 | 9 |
| Electrical Conductivity (% IACS) | 92 | 92 | 87 |
| Thermal Conductivity (BTU/ft²/ft/hr/°F.) | 211 | 211 | 200 |

Strip materials nominally having yield strengths nominally in the range of about 70 ksi to about 80 ksi and over 85% IACS electrical conductivity and about 200 BTU/ft²/ft/hr/° F. thermal conductivity are of interest for electronic lead frame applications. Material having, for example, an 80 ksi yield strength, provides greater stiffness in the leads while material having, for example, a 70 ksi yield strength provides higher ductility and better bend properties.

EXAMPLE 2

Using DSC powder containing about 1.1 wt. % aluminum oxide (C15760), DSC strip having a thickness of about 0.006" was prepared as described in Example 1. The mechanical tests indicated that the as-rolled strip had a nominal yield strength of about 95 ksi. This product is referred to as having a T-95 temper.

The strip was heat treated to provide nominal strengths of about 80 and about 90 ksi, for T-80 and T-90 tempers, respectively. The mechanical properties of as-rolled and heat treated C15760 DSC strip are shown in Table III.

TABLE III

| Typical Mechanical Properties of DSC Strip Containing 1.1 wt. % $Al_2O_3$ | | | |
|---|---|---|---|
| | (as-rolled) | (heat treated) | |
| Temper | T-95 | T-90 | T-80 |
| U.T.S. (ksi) | 106 | 100 | 90 |
| 0.2% YS (ksi) | 85 | 90 | 83 |
| Elongation (% in 2") | 7 | 8 | 9 |

This strip had an electrical conductivity of about 78% IACS and a thermal conductivity of about 177 BTU/ft²/ft/hr/° F.

The finished rolled strip, such as but not limited to, the 0.006 inch strip discussed here, was slit to specified width, tension levelled, and fabricated into lead frames by stamping or chemical etching. Conventional strip and lead frame manufacturing processes are suitable for C15760 DSC strips.

EXAMPLE 3

DSC powder with about 0.3 wt. % $Al_2O_3$ was contained in a suitable, rectangular metallic canister and the canister was evacuated at elevated temperature, sealed, and hot isostatically pressed. The canister was removed from the consolidated billet and the billet was processed into strip as described in Example 1. Properties of the DSC strip were similar to those shown in Example 1, Table II.

EXAMPLE 4

The recrystallization temperature for extruded DSC containing about 0.3 wt. % $Al_2O_3$ cold rolled from about 0.5" starting thickness without in-process heat treatment, is shown for three finish thicknesses in Table IV below.

Note that the recrystallization temperature increased uniformly as the amount of cold work, or stored energy decreased. This relationship is in keeping with classic recrystallization theory which maintains that cold work is the driving force for recrystallization.

TABLE IV

Recrystallization Temperature for Cold Rolled Strip Made From DSC with 0.3 wt. % $Al_3O_2$, Without In-Process Heat Treatment

| Thickness (inches) | Reduction (%) | Recrystallization Temperature (°F.) |
|---|---|---|
| 0.006 | 98.5 | 700 |
| 0.008 | 98.0 | 800 |
| 0.010 | 97.5 | 900 |

Percent reduction was calculated from a declad size of about 0.5" starting thickness. Recrystallization temperature was determined to be the temperature at which the area of recrystallized material was estimated to be in excess of about 1% of the total cross sectional area. This information was established through viewing at least two longitudinal cross sections, metallographically prepared, at each temperature.

The mechanical properties of about 0.006" thick finish strip are shown in the previously described FIG. 7. It is important to note in FIG. 7 that the yield strength near the recrystallization temperature showed a sharp decrease which coincided with the heat treating temperature required to provide about 70 ksi yield strength. This yield strength level, which serves as the midpoint of the T-70 commercial temper range (T70:65 ksi to 74.9 ksi yield strength) is an established finished product specification.

The more negative slope in the strength curves near the recrystallization temperature will result in a narrower temperature range at which the T-70 can be obtained. This narrower working range for heat treating temperature would not be conducive to establishing repeatable tensile properties. The ductility near the recrystallization temperature shows a minimum in the curve.

As stated previously, this behavior with respect to the reduced elongation levels near the recrystallization temperature is not typical for metals. Finished strips which were about 0.008" and 0.010" thick, and rolled to final gage without inprocess heat treatment, had similar behavior.

In process heat treatment reduces the driving force of recrystallization by eliminating or at least reducing stored internal energy resulting from cold work. Table V compares the recrystallization temperatures for three finish thickness with no in-process heat treating and with in-process heat treatments. The in-process heat treatment effectively suppresses recrystallization in the finished product by raising the temperature of recrystallization by about 300° to about 500° F. depending on final thickness.

TABLE V

Recrystallization Temperature for Cold Rolled 0.3 wt. % $Al_3O_2$ With and Without In Process Heat Treatment

| Thickness (inches) | Recrystallization Temperature (°F) | |
|---|---|---|
| | Without Heat Treat | With Heat Treat |
| 0.006 | 700 | 1000 |
| 0.008 | 900 | 1400 |
| 0.010 | 1000 | 1400 |

Referring to FIG. 8 for strip made from DSC with 0.3 wt. % $Al_2O_3$ ("GLIDCOP" AL-15) with a final thickness of about 0.006"., it can be observed that the yield strength did not decrease as rapidly when compared to the curves shown in FIG. 7 for AL-15 rolled without in-process heat treatment. The decreased ductility near the recrystallization temperature, however, was not eliminated. Note also that the recrystallization temperature remained near the heat treating temperature required to provide yield strengths in the T-70 temper range.

It is sufficient to note that about 0.008" and about 0.010" finish strips responded to the in-process heat treatment in a like fashion.

Metallographic evaluation of specimens about 0.006", about 0.008", and about 0.010" finish strip with two in-process heat treatments showed no evidence of recrystallization.

The mechanical property data for about 0.006" thick strip shown in FIG. 9 did not exhibit the characteristic minimum in the elongation or sharp decrease in strength levels previously associated with partial recrystallization of the cold worked microstructure. Hence, the T-70 temper was easily obtained.

What is claimed is:

1. A thin section of fibrous dispersion strengthened copper body containing a refractory metal oxide in an amount equivalent to from about 0.1% to about 1.1% by weight as discrete micro particles having a particle size of less than about 0.1 micron uniformly dispersed throughout said body, said body being characterized by a sufficiently elevated recrystallization temperature to provide a yield strength from about 65 ksi to about 90 ksi without recrystallization, at a predetermined thickness, said elevated recrystallization temperature resulting from cold size reducing said body in successive stages and heating said body to a temperature of at least about 600° F. at intervals during said size reduction.

2. A thin section fibrous, unrecrystallized dispersion strengthened copper body as defined in claim 1 having an electrical conductivity of at least about 78% IACS and thermal conductivity of at least 150 $BTU/ft^2/ft/hr/°F$.

3. A thin section fibrous, unrecrystallized dispersion strengthened copper body as defined in claim 1 wherein the refractory metal oxide is aluminum oxide.

4. A thin section fibrous, unrecrystallized dispersion strengthened copper body as defined in claim 1 wherein the fibrous, unrecrystallized dispersion strengthened copper body is an integrated circuit lead frame.

5. A thin section fibrous, unrecrystallized dispersion strengthened copper body as defined in claim 1 wherein the body has a thickness of from about 0.001" to about 0.030".

6. A thin section fibrous, unrecrystallized dispersion strengthened copper body as defined in claim 1 wherein the body has a thickness of from about 0.004" to about 0.006".

7. A method of making a thin section fibrous, unrecrystallized dispersion strengthened copper body containing a refractory metal oxide in an amount equivalent to from about 0.1% to about 1.1% by weight as discrete microparticles having a particle size of less than about 0.1 micron uniformly dispersed throughout said body, which comprises the steps of consolidating a powder of said dispersion strengthened copper to substantially full density to form a solid body, reducing the size of said body in successive stages, at intervals during said size reduction heating the body to a temperature of at least about 600° F. until the recrystallization temperature of the body at finish thickness has been elevated sufficiently to provide a yield strength of from about 65 ksi to about 90 ksi without recrystallization.

8. A method as defined in claim 7 wherein the refractory metal is aluminum oxide.

9. A method as defined in claim 7 wherein consolidation is to a density of from about 97% to about 100% of theoretical density.

10. A method as defined in claim 7 wherein consolidation is effected by extrusion.

11. A method as defined in claim 10 wherein consolidation is effected by extrusion in a copper can.

12. A method as defined in claim 11 wherein the copper can is removed from the consolidated body after extrusion.

13. A method as defined in claim 7 wherein consolidation is effected by hot isostatic pressing.

14. A method as defined in claim 10 wherein the size of the body is reduced in successive stages to about 0.005".

15. A method as defined in claim 7 wherein the body is reduced in thickness by cold rolling.

16. A method as defined in claim 15 wherein the thickness of the body is reduced to a convenient thickness, inprocess heat treated from about 1200° F. to about 1600° F. for about 1 hour and then further reduced by cold rolling.

17. A method as defined in claim 16 wherein the body is heat treated at a temperature of from about 600° F. to about 1800° F. for 1 hour.

18. A thin section dispersion strengthened copper strip having a yield strength in the range of about 80 ksi to about 95 ksi, a thermal conductivity of at least 150 BTU/ft$^2$/ft/hr/°F. and an electrical conductivity of about 78% IACS.

19. A dispersion strengthened copper lead frame wherein the leads have a yield strength in the range of about 80 ksi to about 95 ksi, a thermal conductivity of about 177 BTU/ft$^2$/ft/hr/°F. and an electrical conductivity of about 78% IACS.

20. A dispersion strengthened copper strip material for use in the manufacture of high pin count lead frames, having superior strength, thermal conductivity, and electrical conductivity.

21. A lead frame, made from the strip material of claim 20, having superior stiffness, and superior heat dissipation characteristics.

* * * * *